United States Patent
Mozipo et al.

(10) Patent No.: US 12,292,752 B2
(45) Date of Patent: May 6, 2025

(54) ELECTRONIC SYSTEMS FOR INTEGRATED CIRCUITS AND VOLTAGE REGULATORS

(71) Applicant: Intel Corporation, Santa Clara, CA (US)

(72) Inventors: Aurelien Mozipo, Portland, OR (US); Archanna Srinivasan, San Jose, CA (US); Guang Chen, Fremont, CA (US); Janani Chandrasekhar, San Jose, CA (US)

(73) Assignee: Altera Corporation, San Jose, CA (US)

( * ) Notice: Subject to any disclaimer, the term of this patent is extended or adjusted under 35 U.S.C. 154(b) by 1075 days.

(21) Appl. No.: 17/031,446

(22) Filed: Sep. 24, 2020

(65) Prior Publication Data

US 2021/0004032 A1    Jan. 7, 2021

(51) Int. Cl.
*G05F 1/56* (2006.01)
*H03K 17/22* (2006.01)
*H03K 19/17736* (2020.01)

(52) U.S. Cl.
CPC ............... *G05F 1/56* (2013.01); *H03K 17/22* (2013.01); *H03K 19/17736* (2013.01)

(58) Field of Classification Search
CPC ..... G05F 1/56; H03K 17/22; H03K 19/17736
See application file for complete search history.

(56) References Cited

U.S. PATENT DOCUMENTS

| | | | |
|---|---|---|---|
| 7,746,113 B1 * | 6/2010 | Young | H03K 19/17788 326/80 |
| 9,847,323 B1 | 12/2017 | Lesea | |
| 2010/0188123 A1 * | 7/2010 | Fox | H02M 1/36 327/143 |
| 2014/0312483 A1 | 10/2014 | Vo et al. | |
| 2019/0068186 A1 * | 2/2019 | Hoogzaad | G06F 11/3055 |
| 2019/0333550 A1 * | 10/2019 | Fisch | G11C 11/4074 |

* cited by examiner

*Primary Examiner* — Lincoln D Donovan
*Assistant Examiner* — James G Yeaman
(74) *Attorney, Agent, or Firm* — InventIQ Legal LLP; Steven J. Cahill (57) ABSTRACT

An electronic system includes first, second, third, and fourth integrated circuit dies. The third integrated circuit die has a first voltage regulator circuit. A supply voltage output of the first voltage regulator circuit is coupled to provide a first supply voltage to a supply voltage input of the first integrated circuit die. The first voltage regulator circuit generates a first power ready signal that indicates when the first supply voltage has reached a first threshold voltage. The fourth integrated circuit die has a second voltage regulator circuit that generates a second supply voltage in response to the first power ready signal. A supply voltage output of the second voltage regulator circuit is coupled to provide the second supply voltage to a supply voltage input of the second integrated circuit die.

20 Claims, 5 Drawing Sheets

ELECTRONIC SYSTEMS FOR INTEGRATED CIRCUITS AND VOLTAGE REGULATORS

FIELD OF THE DISCLOSURE

The present disclosure relates to electronic systems, and more particularly, to electronic systems for integrated circuits and voltage regulator circuits.

BACKGROUND

In many integrated circuit packages that have multiple integrated circuit dies, the power for each integrated circuit die in the integrated circuit package is controlled by a single on-package voltage regulator or by a single on-board voltage regulator. In these implementations, all of the integrated circuit dies in the package operate at the same supply voltage, and the single voltage regulator provides supply current for all of the integrated circuit dies in the package. The voltage regulator also takes up board layers to implement shorting of power between the integrated circuit dies, which adds to the cost of the system.

DETAILED DESCRIPTION

Many electronic systems include multiple integrated circuit dies that are in the same package or that are connected to the same circuit board. In some multi-die packages, digital power for each integrated circuit die in the package is controlled by a single on-package voltage regulator (OPVR) or a single on-board voltage regulator (OBVR). Users of these packages design the circuit boards to support the multiple integrated circuit dies in the package with a single voltage regulator, which can add complexity to the board design. The voltage regulator needs to have enough current carrying capacity for multiple integrated circuit dies and takes up board layers (adding to production cost) to implement shorting of power between the integrated circuit dies.

Another problem with this scheme is that all of the integrated circuit dies in the package operate at the same supply voltage. As a result, the integrated circuit dies in the same package cannot have any voltage margining and binning that would have each integrated circuit die operate at a different supply voltage to compensate for process variations. Also, integrated circuit dies in the same package that are not used cannot be turned off to save power. According to some embodiments disclosed herein, each integrated circuit die in a package or other electronic system is individually controlled by its own OPVR or OBVR, and the voltages regulators power up the integrated circuit dies in a predefined sequencing order.

According to some embodiments disclosed herein, an electronic system has multiple integrated circuit dies including two or more voltage regulator integrated circuit (IC) dies. Voltage regulator circuits in the voltage regulator IC dies provide supply current and supply voltages to two or more of the other IC dies in the electronic system. Each of these other IC dies receives a supply voltage from a different voltage regulator circuit, and as a result, each of these other IC dies can receive a different supply voltage. The supply voltages can be selected based on differences between these IC dies.

These embodiments may have several advantages. For example, the integrated circuit (IC) dies in the electronic system that are fast and slow can be identified and separated during IC manufacturing according to standard process binning techniques. Then, an ideal supply voltage can be determined for each of the IC dies that accommodates for semiconductor process variations between the IC dies. The voltage regulator circuits in the electronic system can then be configured to provide the ideal supply voltages to the IC dies to account for the process variations. As an example, larger supply voltages can be provided to IC dies in the system that have slower corner transistors, and smaller supply voltages can be provided to IC dies in the system that have faster corner transistors.

Many field programmable gate arrays (FPGAs) have power on reset (POR) monitoring circuits to monitor power anomalies of all of the major power rails and to put the system in a reset (safe) state to make sure there is no functional or reliability damage in response to a power anomaly. In a system in which the digital power rails of the integrated circuits in a package are shorted together, the main power-on reset (POR) circuit asserts a power good signal in response to an output of the voltage regulator. In some embodiments disclosed herein, an individual voltage regulator is provided for each integrated circuit (e.g., each transceiver and each FPGA) in an electronic system (e.g., in a package). A POR scheme is provided to improve the efficiency of the system, because it would be inefficient to provide outputs for each of the voltages regulators into the main POR circuit causing multiple individual POR circuits instead of 1 POR circuit to output a power good signal.

In some embodiments disclosed herein, two or more voltage regulator integrated circuit (IC) dies in an electronic system are coupled in a daisy-chain. Each of the voltage regulator IC dies includes a voltage regulator circuit that generates a supply voltage and that asserts a power ready output signal in response to the supply voltage reaching a threshold voltage that indicates a desired supply voltage level. Each of the second and subsequent voltage regulator IC dies coupled in the daisy-chain generates its supply voltage in response to the power ready output signal of one or more of the previous voltage regulator IC dies coupled in the daisy-chain. In some embodiments, an IC die that receives the supply voltage generated by the last one of the voltage regulator IC dies coupled in the daisy-chain may include a power-on reset (POR) monitoring circuit. The POR monitoring circuit can detect an anomaly in any of the supply voltages generated by any of the voltage regulator IC dies coupled in the daisy-chain. If the POR monitoring circuit determines that the supply voltage is not at a desired voltage level, the POR monitoring circuit can put the IC die into a reset state to prevent functional or reliability damage. These embodiments may reduce the number of POR monitoring circuits in the system (e.g., to a single POR monitoring circuit) to reduce IC die area, as well as to reduce design and integration difficulties.

Figure 1:
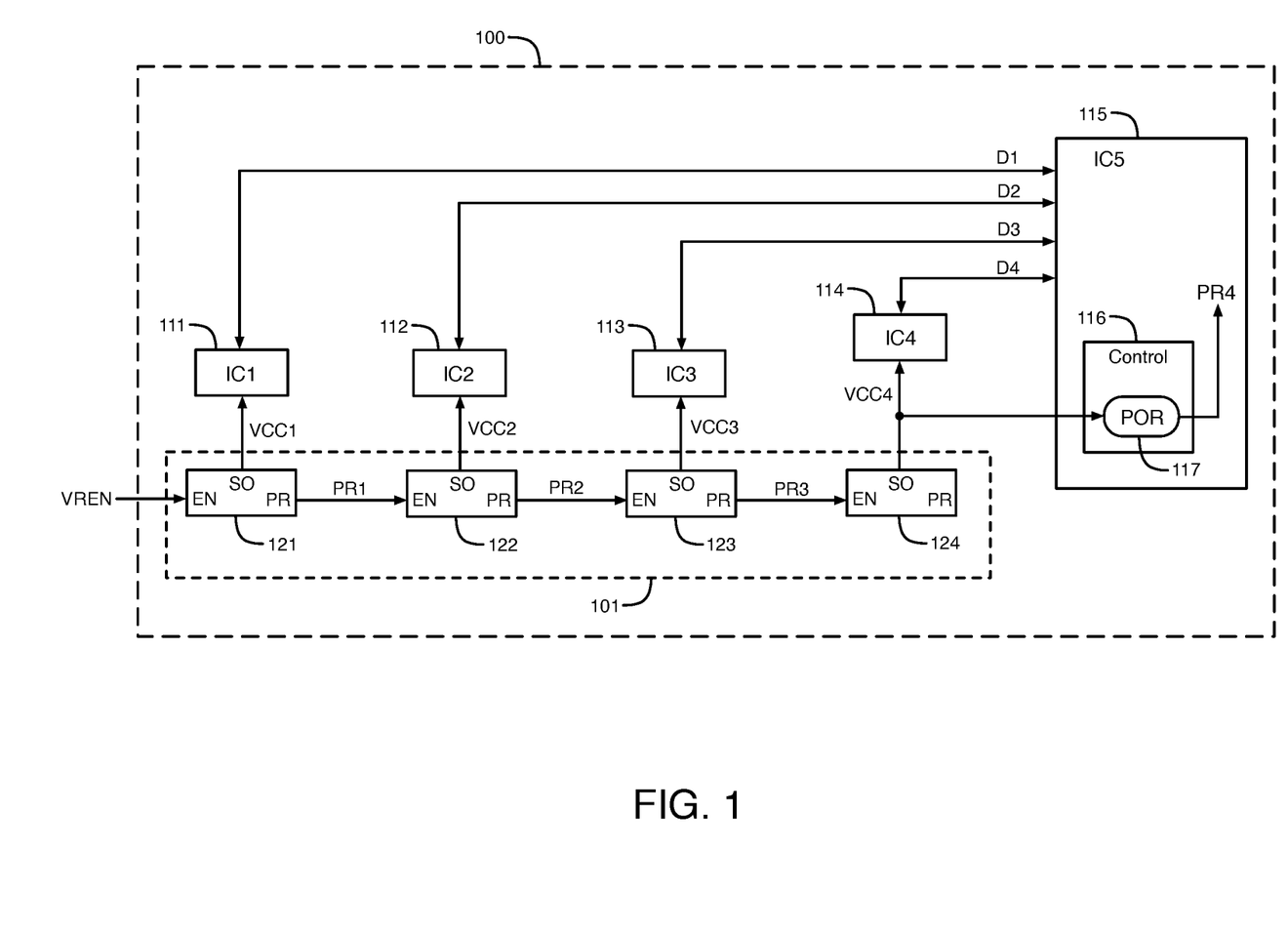
FIG. 1 illustrates an example of an electronic system with four daisy-chain voltage regulator integrated circuit dies and five additional integrated circuit dies that are coupled to the voltage regulator integrated circuit dies, according to an embodiment.

FIG. 1 illustrates an example of an electronic system 100 with four daisy-chain voltage regulator integrated circuit dies and five additional integrated circuit dies that are coupled to the voltage regulator integrated circuit dies, according to an embodiment. Four of the additional integrated circuit (IC) dies receive four separate supply voltages VCC1-VCC4 from the four voltage regulator IC dies. The voltage regulator IC dies are coupled together in a daisy-chain such that power ready signals propagate in serial from one voltage regulator IC die to the next voltage regulator IC die in the daisy-chain. Each of the voltage regulator IC dies generates a supply voltage for one of the additional IC dies in response to an input power ready or enable signal. As used herein, the term "coupled" may refer to direct connections between circuits and indirect connections that allow signal transmission between circuits.

Figure (FIG. 1 shows an electronic system 100 that has four voltage regulator integrated circuit (IC) dies 121-124 and five additional integrated circuit (IC) dies 111-115. Although 4 voltage regulator IC dies and 5 additional IC dies are shown in FIG. 1, electronic systems in other embodiments may have any number of voltage regulator IC dies and any number of additional IC dies that are coupled to the voltage regulator IC dies. Each of the voltage regulator integrated circuit dies 121-124 includes a voltage regulator circuit that generates a supply voltage at a supply voltage output in response to a power ready or enable input signal. As shown in FIG. 1, the voltage regulator circuits in IC dies 121-124 generate supply voltages VCC1-VCC4, respectively, at their supply voltage outputs SO. Each of the supply voltages VCC1-VCC4 is provided through one or more conductors in system 100 to a separate one of the IC dies 111-114. The supply voltages VCC1-VCC4 are provided to supply voltage inputs of IC dies 111-114, respectively. VCC4 is also provided to an input of a power-on reset (POR) monitoring circuit 117 in IC die 115.

According to various embodiments, the integrated circuit dies shown in FIG. 1 in electronic system 100 may be coupled together through conductors in one or more circuit boards or through conductors in one or more integrated circuit packages. As a specific example that is not intended to be limiting, all 9 of the integrated circuit dies 111-115 and 121-124 shown in FIG. 1 may be housed in a single integrated circuit package. In this example, the electronic system 100 may be referred to as an on-package voltage regulator system. As another example that is not intended to be limiting, integrated circuit dies 111-115 may be housed in a first integrated circuit package, each of the voltage regulator integrated circuit dies 121-124 may be housed in a separate integrated circuit package, and voltage regulator integrated circuit dies 121-124 may be coupled to a circuit board 101 that is outside the 5 integrated circuit packages. This example may be referred to as an on-board voltage regulator system. As yet another example that is not intended to be limiting, integrated circuit dies 111-115 may be housed in a first integrated circuit package, and integrated circuit dies 121-124 may be housed in a second integrated circuit package 101.

Voltage regulator IC dies 121-124 are coupled together in series to implement a daisy-chain power ready configuration. In this configuration, each of the voltage regulator circuits in IC dies 121-124 is enabled to generate an output supply voltage in response to a power ready or enable input signal being asserted. As each voltage regulator circuit in IC dies 121-124 is enabled, the voltage regulator circuit generates a supply voltage at its supply voltage output. When the supply voltage of each voltage regulator circuit reaches a threshold voltage and no error is detected in the supply voltage, the next voltage regulator circuit in the daisy-chain is enabled to generate its output supply voltage.

Each voltage regulator IC die (except the last voltage regulator IC die in the daisy-chain) may, for example, include a comparator circuit that compares the output supply voltage of the voltage regulator circuit to a threshold voltage. In this example, when the comparator circuit determines that the output supply voltage of the voltage regulator circuit has reached the threshold voltage, the comparator circuit asserts its output signal. The output signal of the comparator circuit may be used as a power ready signal that is provided to an enable input of the next voltage regulator IC die in the daisy-chain. The next voltage regulator IC die in the daisy-chain generates its output supply voltage in response to the power ready output signal of the previous voltage regulator IC die in the daisy-chain being asserted.

Referring to FIG. 1, a voltage regulator enable signal VREN is provided from a source outside electronic system 100 to an enable input EN of voltage regulator IC die 121. In response to signal VREN being asserted, the voltage regulator circuit in IC die 121 generates the first supply voltage VCC1 at its supply voltage output SO. The voltage regulator circuit in IC die 121 generates supply voltage VCC1 by increasing or decreasing the voltage at its supply voltage output SO from ground to the desired supply voltage VCC1, which may be a positive or negative voltage. Supply voltage VCC1 and supply current are provided from the supply voltage output SO of IC die 121 to a supply voltage input of IC die 111 to power circuitry in IC die 111.

When the voltage regulator circuit in IC die 121 detects that the voltage at its supply voltage output SO has reached a threshold voltage that indicates the desired supply voltage VCC1 has been reached and no error is detected in the supply voltage at SO, then IC die 121 asserts a first power ready signal PR1 at its power ready output PR. The first power ready signal PR1 is provided through conductors in system 100 to an enable input EN of the next voltage regulator IC die 122 in the daisy-chain. In response to IC die 121 asserting signal PR1, the voltage regulator circuit in IC die 122 generates the second supply voltage VCC2 at its supply voltage output SO. The voltage regulator circuit in IC die 122 generates supply voltage VCC2 by increasing or decreasing the voltage at its supply voltage output SO from ground to the desired supply voltage VCC2, which may be a positive or negative voltage. Supply voltage VCC2 and supply current are provided from the supply voltage output SO of IC die 122 through conductors in system 100 to a supply voltage input of IC die 112 to power circuitry in IC die 112.

When the voltage regulator circuit in IC die 122 detects that the supply voltage at its supply voltage output SO has reached a threshold voltage that indicates the desired supply voltage VCC2 has been reached and no error is detected in the supply voltage at SO, then IC die 122 asserts a second power ready signal PR2 at its power ready output PR. The second power ready signal PR2 is provided through conductors in system 100 to an enable input EN of the next voltage regulator IC die 123 in the daisy-chain. In response to signal PR2 being asserted, the voltage regulator circuit in IC die 123 generates the third supply voltage VCC3 at its supply voltage output SO. The voltage regulator circuit in IC die 123 generates supply voltage VCC3 by increasing or decreasing the voltage at its supply voltage output SO from ground to the desired supply voltage VCC3, which may be a positive or negative voltage. Supply voltage VCC3 and supply current are provided from the supply voltage output SO of IC die 123 through conductors in system 100 to a supply voltage input of IC die 113 to power circuitry in IC die 113.

When the voltage regulator circuit in IC die 123 detects that the voltage at its supply voltage output SO has reached a threshold voltage indicating the desired supply voltage VCC3 has been reached and no error is detected at the supply voltage output SO, then IC die 123 asserts a third power ready signal PR3 at its power ready output PR. The third power ready signal PR3 is provided through conductors in system 100 to an enable input EN of the next voltage regulator IC die 124 in the daisy-chain. In response to signal PR3 being asserted, the voltage regulator circuit in IC die 124 generates the fourth supply voltage VCC4 at its supply voltage output SO. The voltage regulator circuit in IC die 124 generates supply voltage VCC4 by increasing or decreasing the voltage at its supply voltage output SO from ground to the desired supply voltage VCC4, which may be a positive or negative voltage. Supply voltage VCC4 and supply current are provided from the supply voltage output SO of IC die 124 to a supply voltage input of IC die 114 to power circuitry in IC die 114.

As shown in FIG. 1, supply voltage VCC4 is also provided through conductors in system 100 to an input of a power-on reset (POR) monitoring circuit 117 in IC die 115. POR monitoring circuit 117 is in a control circuit 116 in IC die 115. Control circuit 116 may be, for example, a state machine. When POR monitoring circuit 117 detects that the supply voltage VCC4 has reached a threshold voltage indicating the desired supply voltage VCC4 has been reached without any errors, POR monitoring circuit 117 asserts a fourth power ready signal PR4 at its output. Because voltage regulator IC dies 121-124 are coupled in the daisy-chain power ready configuration disclosed with respect to FIG. 1, the supply voltage VCC4 reaching the threshold voltage without an error indicates that each of the supply voltages VCC1-VCC3 have also reached their desired supply voltage levels without errors. The fourth power ready signal PR4 being asserted indicates that each of the supply voltages VCC1-VCC4 have reached their desired supply voltage levels and do not have errors. The threshold voltages that indicate the desired supply voltages of VCC1-VCC4 may be selected to compensate for process variations between two or more of the IC dies 111-115.

The power ready signal PR4 may, for example, be provided to other circuitry in IC die 115, for example, as a local or global reset signal. The other circuitry in IC die 115 that receives power ready signal PR4 may, for example, be in a reset state in response to the PR4 signal being de-asserted. The other circuitry in IC die 115 that receives power ready signal PR4 can, for example, exit a reset state and begin normal operation in response to signal PR4 being asserted. The other circuitry in IC die 115 that receives power ready signal PR4 can, for example, return to the reset state in response to the PR4 signal being de-asserted to indicate that one or more of the supply voltages VCC1-VCC4 has a voltage anomaly, has decreased below a desired voltage level, or has increased above a desired voltage level.

If a voltage anomaly or error occurs in any of the supply voltages VCC1-VCC3, the voltage regulator circuit in the respective IC die 121-123 de-asserts its respective power ready output signal PR1-PR3. In response to any of the power ready signals PR1-PR3 being de-asserted, the subsequent voltage regulator circuits in the daisy-chain de-assert their output power ready signals. In response to power ready signal PR3 being de-asserted, the voltage regulator circuit in IC die 124 reduces VCC4 below the threshold voltage. When VCC4 decreases below the threshold voltage, POR monitoring circuit 117 de-asserts power ready signal PR4, causing the other circuitry in IC die 115 to reenter the reset state. As an example that is not intended to be limiting, the response time between when the first power ready signal PR1 indicates a power anomaly in VCC1 to when the circuitry in IC die 115 reenters the reset state may be about 3 millisecond.

Because electronic system 100 uses only a single power-on reset monitoring circuit 117 to indicate the voltages of supply voltages VCC1-VCC4 irrespective of the number of IC dies in system 100 that are powered up independently, system 100 uses less IC die area than a system that uses a different power-on reset circuit for each IC die in the system. When an electronic system has multiple IC dies in the same IC package, the power sequencing and reset scheme of FIG. 1 can be used to add more flexibility in the package and board design and to reduce IC die cost.

IC dies 111-115 may be any types of integrated circuit dies. According to a specific example that is not intended to be limiting, IC die 115 may be a programmable logic integrated circuit (such as a field programmable gate array), and IC dies 111-114 may be transceiver IC dies. In this example, each of the transceivers in IC dies 111-114 receives signals from and transmits signals to sources outside of electronic system 100. The transceivers in IC dies 111-114 transmit data received from outside system 100 to IC die 115. The transceivers in IC dies 111-114 transmit data received from IC die 115 to sources outside system 100. As examples, the transceivers in IC dies 111-114 transmit and receive data signals D1-D4, respectively, to and from IC die 115, as shown in FIG. 1. In this example, the power ready signal PR4 may be provided as a reset signal to programmable logic circuitry in the core region of the programmable logic IC 115.

Figure 2:
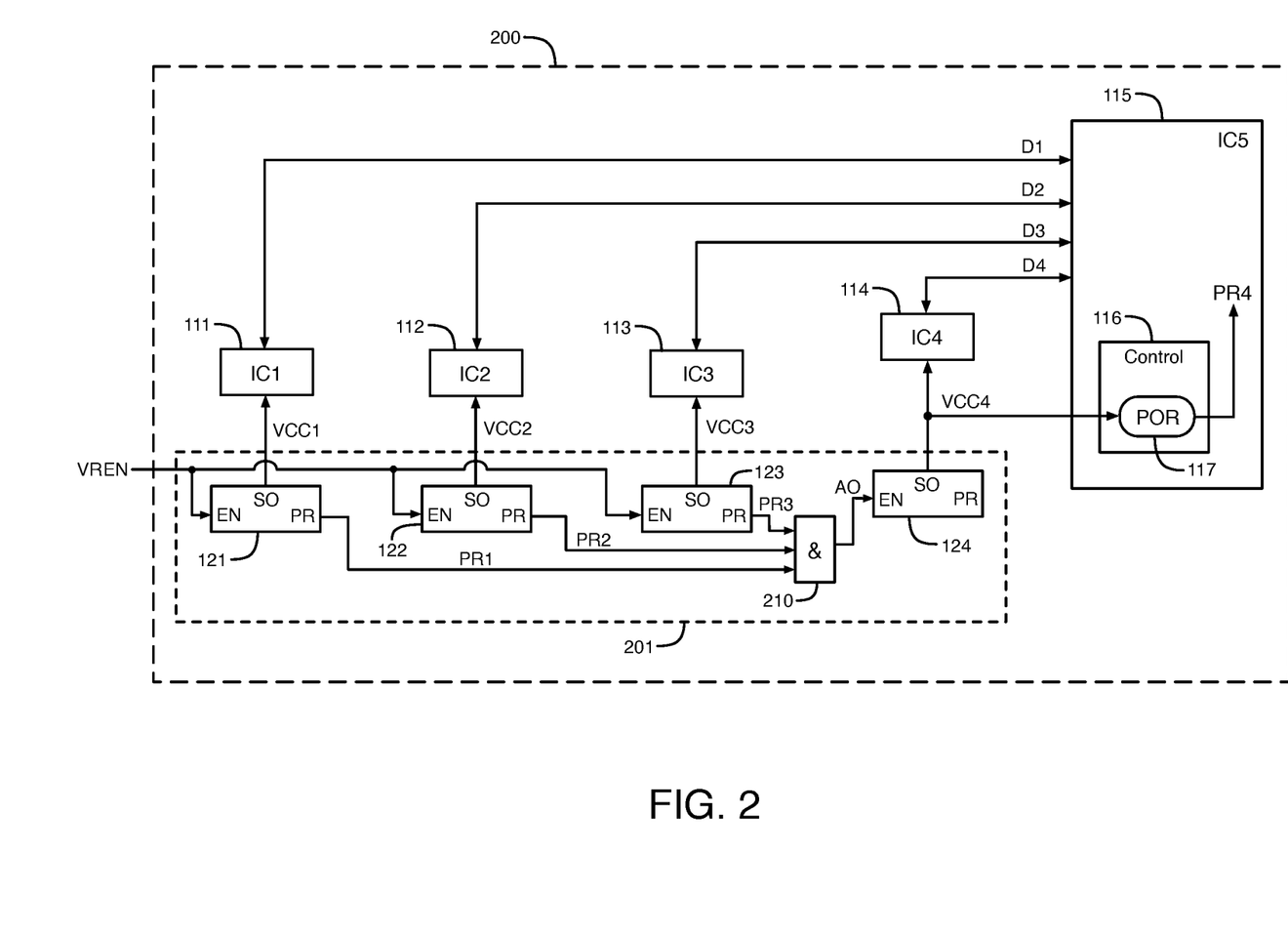
FIG. 2 illustrates another example of an electronic system with four voltage regulator integrated circuit dies and five additional integrated circuit dies that are coupled to the voltage regulator integrated circuit dies, according to another embodiment.

FIG. 2 illustrates another example of an electronic system 200 with four voltage regulator integrated circuit dies and five additional integrated circuit dies that are coupled to the voltage regulator integrated circuit dies, according to another embodiment. In the embodiment of FIG. 2, the power ready output signals of three of the voltage regulator IC dies are combined using a logic gate to generate a power ready signal for the fourth voltage regulator IC die. The power ready output signal of the logic gate circuit being asserted causes the fourth voltage regulator IC die to generate the fourth supply voltage. The fourth supply voltage feeds into power-on reset circuitry in the last additional IC die to generate the last power ready signal.

The embodiment of FIG. 2 reduces the power-on time for an electronic system by about 1/N compared to system 100, where N is the number of voltage regulator IC dies in the electronic system generating power ready output signals that are input into the logic gate circuit. The power-on time refers to the time between when signal VREN is asserted and the time when signal PR4 is asserted. As an example that is not intended to be limiting, the response time between when the first power ready signal PR1 indicates a power anomaly in VCC1 to when the circuitry in IC die 115 reenters the reset state may be about 1 millisecond in the embodiment of FIG. 2.

FIG. 2 shows an electronic system 200 that has four voltage regulator integrated circuit (IC) dies 121-124 and five additional integrated circuit (IC) dies 111-115. Although 4 voltage regulator IC dies and 5 additional IC dies are shown in FIG. 2, electronic systems in other embodiments may have any number of voltage regulator IC dies and any number of additional IC dies that are coupled to the voltage regulator IC dies. As with the embodiment of FIG. 1, the voltage regulator circuits in IC dies 121-124 generate supply voltages VCC1-VCC4, respectively, at their supply voltage outputs SO. Supply voltages VCC1-VCC4 are provided through conductors in system 100 to IC dies 111-115, as shown in FIG. 2. The voltage regulator IC dies 121-124 may, for example, be coupled to the same circuit board 201 or housed in the same package 201. As another example, electronic system 200 may be a single integrated circuit package that houses all of the IC dies shown in FIG. 2.

System 200 also includes a logic gate circuit 210. In the embodiment described herein with respect to FIG. 2, the logic gate circuit 210 is an AND logic gate circuit that performs an AND Boolean logic function on its input signals to generate its output signal. In this embodiment, the power ready output signals PR1-PR3 of the voltage regulator ICs 121-123 are ANDed together by AND logic gate 210 to generate a power ready signal AO for enabling the fourth voltage regulator IC 124. According to other embodiments, logic gate circuit 210 may be another type of logic gate circuit, such as a NAND logic gate, an OR logic gate, or a NOR logic gate.

In the embodiment of FIG. 2, a voltage regulator enable signal VREN is provided from outside system 200 to an enable input EN of each of the first three voltage regulator IC dies 121, 122, and 123, as shown in FIG. 2. The voltage regulator circuits in IC dies 121-123 generate supply voltages VCC1-VCC3, respectively, at their supply voltage outputs SO in response to signal VREN being asserted. Supply voltages VCC1-VCC3 and supply current are provided from the voltage regulator circuits in IC dies 121-123 to supply voltage inputs of IC dies 111-113, respectively, to power circuitry in these IC dies.

As with the embodiment of FIG. 1, the IC dies 121-123 assert the power ready signals PR1-PR3 when the voltages at their supply voltage outputs SO reach the threshold voltages for VCC1-VCC3, respectively, without errors. The three power ready signals PR1-PR3 are provided to inputs of AND logic gate circuit 210. In response to one or more of the power ready signals PR1-PR3 being de-asserted (e.g., in a logic low state), AND logic gate circuit 210 de-asserts its output signal AO. Signal AO functions as a power ready signal that is provided to the enable input EN of voltage regulator IC die 124 in the embodiment of FIG. 2. Voltage regulator IC die 124 maintains the voltage at its supply voltage output SO at ground in response to the power ready signal AO being de-asserted.

In response to all of the power ready signals PR1-PR3 being asserted concurrently (e.g., in logic high states) indicating that supply voltages VCC1-VCC3 have reached their desired voltage levels indicated by the threshold voltages, AND logic gate circuit 210 asserts its output signal AO. In response to signal AO being asserted, the voltage regulator circuit in IC die 124 generates the fourth supply voltage VCC4 at its supply voltage output SO. The voltage regulator circuit in IC die 124 generates supply voltage VCC4 by increasing or decreasing the voltage at its supply voltage output SO from ground to the desired supply voltage VCC4, which may be a positive or negative voltage. Supply voltage VCC4 and supply current are provided from supply voltage output SO of IC die 124 to a supply voltage input of IC die 114 to power circuitry in IC die 114.

Supply voltage VCC4 is also provided to an input of power-on reset (POR) monitoring circuit 117 in IC die 115 in system 200. POR monitoring circuit 117 asserts a power ready signal PR4 in response to detecting that the supply voltage VCC4 has reached a threshold voltage without errors, which indicates that supply voltages VCC1-VCC3 are also at their desired voltage levels. Other circuitry in IC die 115 can, for example, exit the reset state and begin normal operation in response to signal PR4 being asserted. POR monitoring circuit 117 de-asserts signal PR4 to indicate that one or more of the supply voltages VCC1-VCC4 has a voltage anomaly, has decreased below a desired voltage level, or has increased above a desired voltage level. The circuitry in IC die 115 that receives power ready signal PR4 can, for example, return to the reset state in response to the PR4 signal being de-asserted.

As discussed above with respect to FIG. 1, in system 200, IC dies 111-114 may, for example, be transceiver circuits that exchange data signals D1-D4, respectively, with main IC die 115. The main IC die 115 may be, for example, a programmable logic IC die, a processor IC die, or a graphics processing unit IC die.

Figure 3:
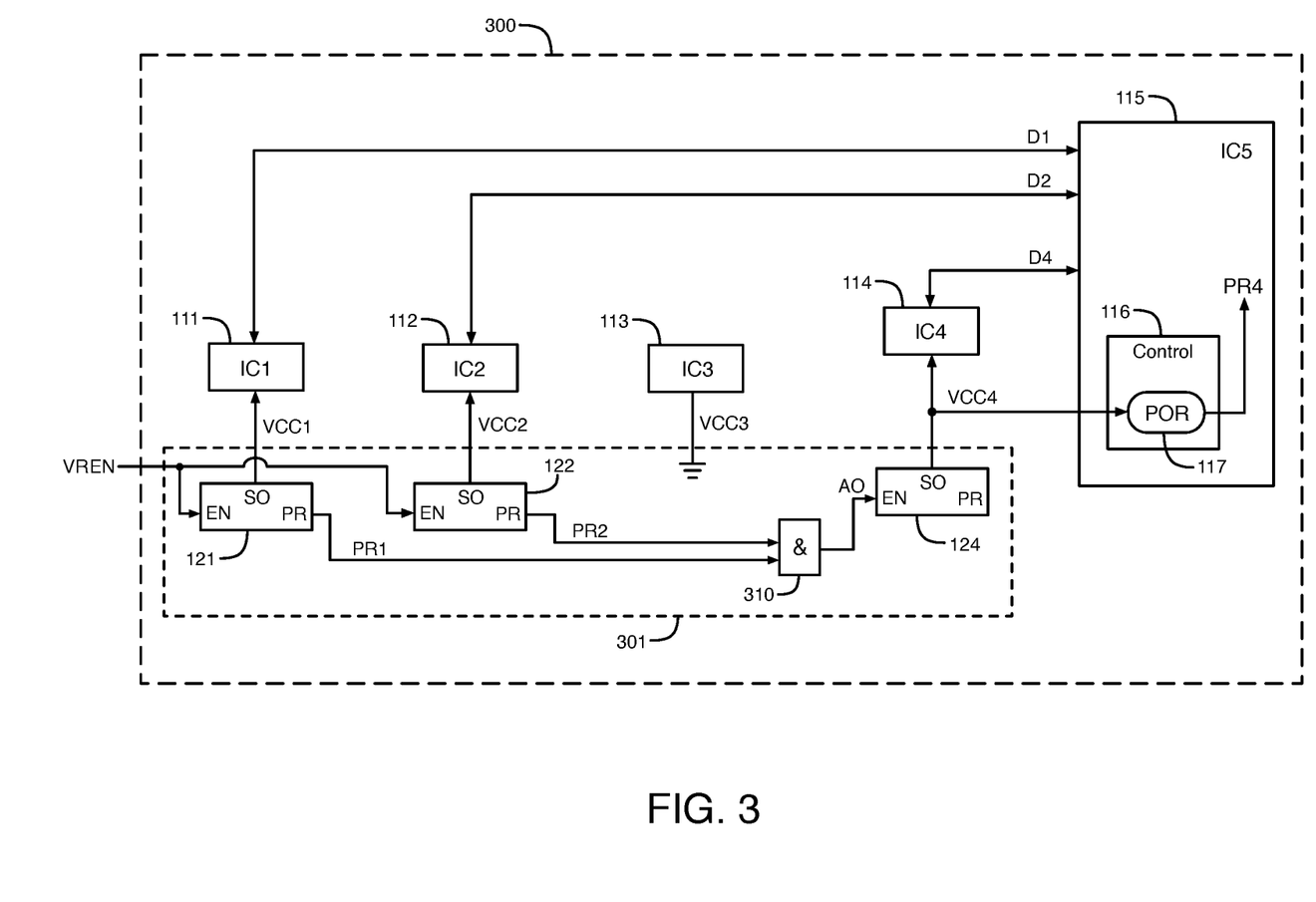
FIG. 3 illustrates an example of an electronic system with three voltage regulator integrated circuit dies and four additional integrated circuit dies that are coupled to the voltage regulator integrated circuit dies, according to another embodiment.

The embodiment of FIG. 2 can be modified to save power. Because system 200 has a separate voltage regulator circuit controlling each IC die 111-114, if one of the IC dies 111-113 is not used, that IC die can be powered down to ground to reduce power consumption in the system. Because AND logic gate circuit 210 independently monitors the three power ready signals PR1-PR3 output by voltage regulator IC dies 121-123, any one or two of the three IC dies 111-113 can be turned off by decoupling its supply voltage input from the respective unused voltage regulator IC die without preventing the supply voltage VCC4 from powering up. The unused voltage regulator IC die can be removed from the electronic system so that the AND gate only responds to the voltage regulator IC dies that are intended to be powered up. FIG. 3 shows an example of how one of the IC dies 111-113 can be decoupled from the system without affecting the power-on operation of the remaining IC dies in the system.

FIG. 3 illustrates an example of an electronic system 300 with three voltage regulator integrated circuit dies and four additional integrated circuit dies that are coupled to the voltage regulator integrated circuit dies, according to another embodiment. FIG. 3 shows an electronic system 300 that has three voltage regulator integrated circuit dies 121-122 and 124 and five additional integrated circuit (IC) dies 111-115. Although 3 voltage regulator IC dies and 5 additional IC dies are shown in FIG. 3, electronic systems in other embodiments may have any number of voltage regulator IC dies and any number of additional IC dies that receive supply voltages from the voltage regulator IC dies.

In the electronic system 300 of FIG. 3, the power supply input of the third IC die 113 is coupled to ground to turn off unused IC die 113, and voltage regulator IC die 123 is removed from electronic system 300 to reduce power consumption in system 300. The power ready output signals PR1-PR2 of the voltage regulator IC dies 121-122 are combined using an AND logic gate circuit 310 to generate a power ready signal AO at the output of the AND logic gate circuit 310. According to alternative embodiments, logic gate 310 may be another type of logic gate circuit, such as a NAND, OR, or NOR logic gate. The power ready output signal AO is provided through conductors to an enable input EN of the fourth voltage regulator IC die 124. AND logic gate circuit 310 asserts power ready signal AO in response to both of signals PR1-PR2 being concurrently asserted to indicate that the supply voltages VCC1-VCC2 have reached their desired voltage levels without errors. The power ready signal AO being asserted causes the fourth voltage regulator IC die 124 to generate the fourth supply voltage VCC4 at its supply voltage output SO. The fourth supply voltage VCC4 is provided to the supply voltage input of IC die 114 and to an input of the power-on reset (POR) monitoring circuitry 117 to generate the power ready signal PR4 for the IC die 115, as with the previous embodiments.

Figure 4:
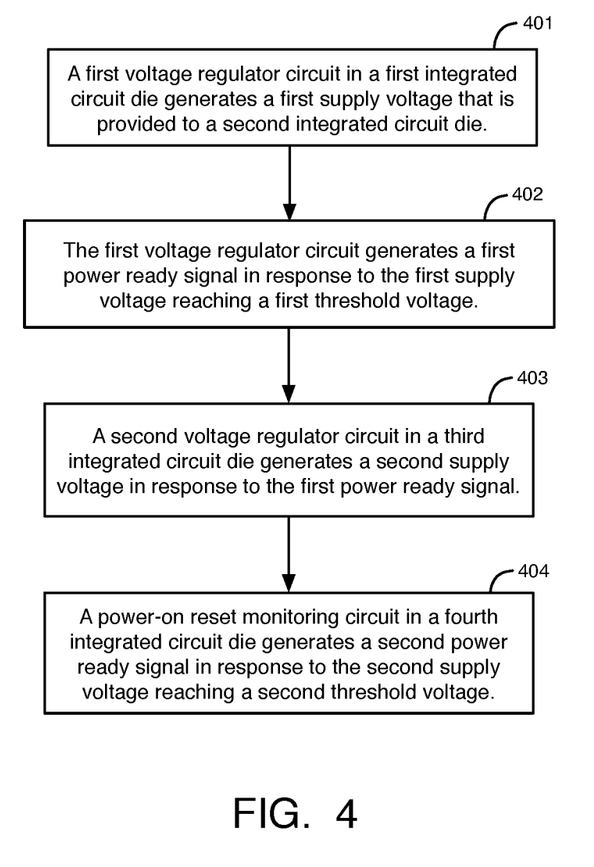
FIG. 4 is a flow chart that shows examples of operations that may be performed to implement power-on reset using in an electronic system having multiple integrated circuit dies, according to an embodiment.

FIG. 4 is a flow chart that shows examples of operations that can be performed to implement power-on reset using in an electronic system having multiple integrated circuit dies, according to an embodiment. In operation 401, a first voltage regulator circuit in a first integrated circuit die generates a first supply voltage that is provided to a second integrated circuit die. Voltage regulator IC dies 121-123 are examples of the first integrated circuit die, and IC dies 111-113 are examples of the second integrated circuit die. In operation 402, the first voltage regulator circuit generates a first power ready signal in response to the first supply voltage reaching a first threshold voltage. Power ready signals PR1-PR3 are examples of the first power ready signal. In operation 403, a second voltage regulator circuit in a third integrated circuit die generates a second supply voltage in response to the first power ready signal. Voltage regulator IC dies 122-124 are examples of the third integrated circuit die. In operation 404, a power-on reset monitoring circuit in a fourth integrated circuit die generates a second power ready signal in response to the second supply voltage reaching a second threshold voltage. Power-on reset monitoring circuit 117 in IC die 115 is an example of the power-on reset monitoring circuit of operation 404.

Figure 5:
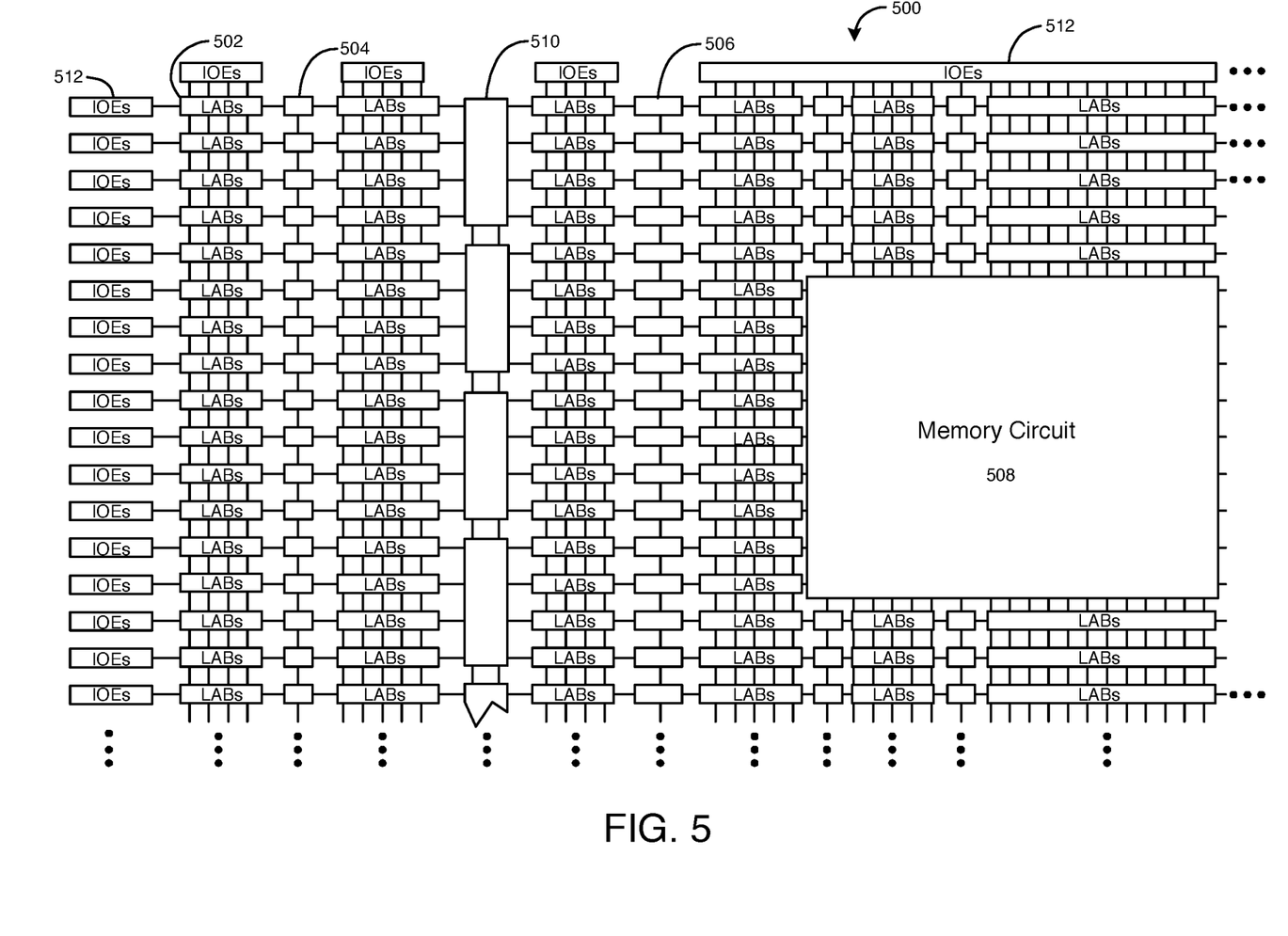
FIG. 5 is a simplified partial block diagram of a field programmable gate array (FPGA) that can be part of embodiments disclosed herein.

FIG. 5 is a simplified partial block diagram of a field programmable gate array (FPGA) 500 that can be part of embodiments disclosed herein. FPGA 500 is merely one example of integrated circuit die 115 of FIGS. 1-3. It should be understood that embodiments disclosed herein can be used with numerous types of integrated circuits, such as field programmable gate arrays (FPGAs), programmable logic devices (PLDs), complex programmable logic devices (CPLDs), programmable logic arrays (PLAs), and other types of integrated circuits having programmable and/or non-programmable logic circuits.

FPGA 500 includes a two-dimensional array of programmable logic array blocks (or LABs) 502 that are interconnected by a network of vertical and horizontal programmable interconnect resources of varying length and speed. Each of LABs 502 includes multiple (e.g., 10) logic elements (or LEs).

A logic element (LE) is a programmable logic circuit that provides for efficient implementation of user defined logic functions. An FPGA has numerous logic elements that can be configured to implement various combinatorial and sequential functions. The logic elements have access to the programmable interconnect resources. The programmable interconnect resources can be programmed to interconnect the logic elements in almost any desired configuration.

FPGA 500 may also include a distributed memory structure including random access memory (RAM) circuits of varying sizes provided throughout the array. The RAM circuits include, for example, circuits 504, circuits 506, and circuit 508. These memory circuits can also include shift registers and first-in first-out (FIFO) circuits.

FPGA 500 may further include digital signal processing (DSP) circuits 510 that can implement, for example, multipliers with add or subtract features. Input/output elements (IOEs) 512 located, in this example, around the periphery of the IC, support numerous single-ended and differential input/output standards. IOEs 512 are coupled to pads. Each of the pads is an external terminal of the FPGA.

The integrated circuits described herein may be part of a data processing system that includes one or more of the following components: a processor; memory; input/output circuitry; and peripheral devices. The integrated circuits can be used in a wide variety of applications, such as computer networking, data networking, instrumentation, video processing, digital signal processing, or any suitable other application.

According to another embodiment, an electronic system includes, first, second, third, and fourth integrated circuit dies. The third integrated circuit die includes a first voltage regulator circuit. A supply voltage output of the first voltage regulator circuit is coupled to a supply voltage input of the first integrated circuit die. The fourth integrated circuit die includes a second voltage regulator circuit. A supply voltage output of the second voltage regulator circuit is coupled to a supply voltage input of the second integrated circuit die. An enable input of the second voltage regulator circuit is responsive to a power ready output of the first voltage regulator circuit that indicates when the supply voltage output of the first voltage regulator circuit has reached a threshold voltage.

According to yet another embodiment, an integrated circuit package includes a first transceiver integrated circuit die, a programmable logic integrated circuit die, a first voltage regulator integrated circuit die, and a second voltage regulator integrated circuit die. A supply voltage output of the first voltage regulator integrated circuit die is coupled to a supply voltage input of the first transceiver integrated circuit die. A supply voltage output of the second voltage regulator integrated circuit die is coupled to a power-on reset input of a power-on reset monitoring circuit in the programmable logic integrated circuit die.

The following examples pertain to further embodiments. Example 1 is an electronic system comprising: first and second integrated circuit dies; a third integrated circuit die comprising a first voltage regulator circuit, wherein a supply voltage output of the first voltage regulator circuit is coupled to provide a first supply voltage to a supply voltage input of the first integrated circuit die, and wherein the first voltage regulator circuit generates a first power ready signal that indicates when the first supply voltage has reached a first threshold voltage; and a fourth integrated circuit die comprising a second voltage regulator circuit that generates a second supply voltage in response to the first power ready signal, wherein a supply voltage output of the second voltage regulator circuit is coupled to provide the second supply voltage to a supply voltage input of the second integrated circuit die.

In Example 2, the electronic system of Example 1 can optionally further comprise: a fifth integrated circuit die, wherein the second voltage regulator circuit generates a second power ready signal that indicates when the second supply voltage has reached a second threshold voltage; and a sixth integrated circuit die comprising a third voltage regulator circuit that generates a third supply voltage in response to the second power ready signal, wherein a supply voltage output of the third voltage regulator circuit is coupled to provide the third supply voltage to a supply voltage input of the fifth integrated circuit die.

In Example 3, the electronic system of Example 1 can optionally further comprise: a fifth integrated circuit die; and a sixth integrated circuit die comprising a third voltage regulator circuit that generates a third supply voltage, wherein a supply voltage output of the third voltage regulator circuit is coupled to provide the third supply voltage to a supply voltage input of the fifth integrated circuit die, and wherein the third voltage regulator circuit generates a second power ready signal that indicates when the third supply voltage has reached a second threshold voltage.

In Example 4, the electronic system of Example 3 can optionally further comprise: a logic gate circuit that generates a third power ready signal based on the first and second power ready signals generated by the first and third voltage regulator circuits, wherein the second voltage regulator circuit generates the second supply voltage in response to the third power ready signal.

In Example 5, the electronic system of any one of Examples 3 or 4 can optionally further comprise: a seventh integrated circuit die comprising a power-on reset monitoring circuit, wherein the power-on reset monitoring circuit generates a power-on reset signal for the seventh integrated circuit die in response to the second supply voltage reaching a third threshold voltage.

In Example 6, the electronic system of Example 1 can optionally further comprise: a fifth integrated circuit die comprising a power-on reset monitoring circuit, wherein the power-on reset monitoring circuit generates a power-on reset signal for the fifth integrated circuit die in response to the second supply voltage generated by the second voltage regulator circuit.

In Example 7, the electronic system of any one of Examples 1-6 can optionally include, wherein the first and second integrated circuit dies are in a single integrated circuit package, and wherein the third and fourth integrated circuit dies are coupled to a circuit board outside the single integrated circuit package.

In Example 8, the electronic system of any one of Examples 1-6 can optionally include, wherein the first, second, third and fourth integrated circuit dies are housed in a single integrated circuit package.

Example 9 is an integrated circuit package comprising: a first transceiver integrated circuit die; a programmable logic integrated circuit die; a first voltage regulator integrated circuit die, wherein a supply voltage output of the first voltage regulator integrated circuit die is coupled to a supply voltage input of the first transceiver integrated circuit die; and a second voltage regulator integrated circuit die, wherein a supply voltage output of the second voltage regulator integrated circuit die is coupled to an input of the programmable logic integrated circuit die.

In Example 10, the integrated circuit package of Example 9 can optionally further comprise: a second transceiver integrated circuit die, wherein the supply voltage output of the second voltage regulator integrated circuit die is coupled to a supply voltage input of the second transceiver integrated circuit die.

In Example 11, the integrated circuit package of Example 9 can optionally further comprise: a second transceiver integrated circuit die; and a third voltage regulator integrated circuit die, wherein a supply voltage output of the third voltage regulator integrated circuit die is coupled to a supply voltage input of the second transceiver integrated circuit die.

In Example 12, the integrated circuit package of Example 11 can optionally further comprise: a logic gate circuit comprising a first input coupled to a power ready output of the first voltage regulator integrated circuit die, a second input coupled to a power ready output of the third voltage regulator integrated circuit die, and an output coupled to an enable input of the second voltage regulator integrated circuit die.

In Example 13, the integrated circuit package of any one of Examples 11-12 can optionally further comprise: a third transceiver integrated circuit die, wherein the supply voltage output of the second voltage regulator integrated circuit die is coupled to a supply voltage input of the third transceiver integrated circuit die.

In Example 14, the integrated circuit package of any one of Examples 9-13 can optionally include, wherein the programmable logic integrated circuit die comprises a power-on reset monitoring circuit, wherein the supply voltage output of the second voltage regulator integrated circuit die is coupled to an input of the power-on reset monitoring circuit, and wherein the power-on reset monitoring circuit generates a reset signal for circuitry in the programmable logic integrated circuit die in response to a supply voltage at the supply voltage output of the second voltage regulator integrated circuit die reaching a threshold voltage.

In Example 15, the integrated circuit package of any one of Examples 9-11 or 14 can optionally include, wherein an enable input of the second voltage regulator integrated circuit die is responsive to a power ready output of the first voltage regulator integrated circuit die that indicates when the supply voltage output of the first voltage regulator integrated circuit die has reached a threshold voltage.

Example 16 is a method for performing power-on reset in an electronic system, the method comprising: generating a first supply voltage using a first voltage regulator circuit in a first integrated circuit die, wherein the first supply voltage is provided to a second integrated circuit die; generating a first power ready signal using the first voltage regulator circuit in response to the first supply voltage reaching a first threshold voltage; generating a second supply voltage using a second voltage regulator circuit in a third integrated circuit die in response to the first power ready signal; and generating a second power ready signal using a power-on reset monitoring circuit in a fourth integrated circuit die in response to the second supply voltage reaching a second threshold voltage.

In Example 17, the method of Example 16 can optionally further comprise: generating a third supply voltage using a third voltage regulator circuit in a fifth integrated circuit die, wherein the third supply voltage is provided to a sixth integrated circuit die; and generating a third power ready signal using the third voltage regulator circuit in response to the third supply voltage reaching a third threshold voltage.

In Example 18, the method of Example 17 can optionally include, wherein generating the first supply voltage using the first voltage regulator circuit comprises generating the first supply voltage using the first voltage regulator circuit in response to the third power ready signal.

In Example 19, the method of Example 17 can optionally further comprise: performing a logic function on the first and third power ready signals using a logic gate circuit to generate a fourth power ready signal, wherein generating the second supply voltage using the second voltage regulator circuit comprises generating the second supply voltage using the second voltage regulator circuit in response to the fourth power ready signal.

In Example 20, the method of Example 17 can optionally further comprise: generating a fourth supply voltage using a fourth voltage regulator circuit in a seventh integrated circuit die, wherein the fourth supply voltage is provided to an eighth integrated circuit die; and generating a fourth power ready signal using the fourth voltage regulator circuit in response to the fourth supply voltage reaching a fourth threshold voltage, wherein generating the second supply voltage using the second voltage regulator circuit comprises generating the second supply voltage using the second voltage regulator circuit in response to the first, third, and fourth power ready signals.

In Example 21, the method of Example 20 can optionally further comprise: performing a logic function on the first, third, and fourth power ready signals using a logic gate circuit to generate a fifth power ready signal, wherein generating the second supply voltage using the second voltage regulator circuit comprises generating the second supply voltage using the second voltage regulator circuit in response to the fifth power ready signal.

The foregoing description of the exemplary embodiments has been presented for the purpose of illustration. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. An electronic system comprising:
   first and second integrated circuit dies;
   a third integrated circuit die comprising a first voltage regulator circuit, wherein a first supply voltage output of the first voltage regulator circuit is coupled to provide a first supply voltage to a first supply voltage input of the first integrated circuit die, and wherein the first voltage regulator circuit generates a first power ready signal that indicates when the first supply voltage has reached a first threshold voltage;
   a fourth integrated circuit die comprising a second voltage regulator circuit that generates a second supply voltage, wherein a second supply voltage output of the second voltage regulator circuit is coupled to provide the second supply voltage to a second supply voltage input of the second integrated circuit die, wherein the second voltage regulator circuit generates a second power ready signal that indicates when the second supply voltage has reached a second threshold voltage; and
   a logic gate circuit comprising a first input coupled to receive the first power ready signal, a second input coupled to receive the second power ready signal, and an output that generates a third power ready signal based on the first and the second power ready signals; and
   a fifth integrated circuit die comprising a power-on reset monitoring circuit, wherein the power-on reset monitoring circuit generates a power-on reset signal for the fifth integrated circuit die in response to a third supply voltage generated by a third voltage regulator circuit.

2. The electronic system of claim 1 further comprising:
   a sixth integrated circuit die comprising the third voltage regulator circuit that generates the third supply voltage in response to the third power ready signal, wherein a third supply voltage output of the third voltage regulator circuit is coupled to provide the third supply voltage to a third supply voltage input of the fifth integrated circuit die.

3. The electronic system of claim 1, wherein the power-on reset monitoring circuit generates the power-on reset signal in response to the third supply voltage reaching a third threshold voltage.

4. The electronic system of claim 1 further comprising:
   a sixth integrated circuit die comprising the third voltage regulator circuit that generates the third supply voltage, wherein a third supply voltage output of the third voltage regulator circuit is coupled to provide the third supply voltage to a third supply voltage input of the fifth integrated circuit die.

5. The electronic system of claim 4, wherein the logic gate circuit further comprises a third input coupled to receive a fourth power ready signal.

6. The electronic system of claim 1,
   wherein the third voltage regulator circuit generates the third supply voltage in response to the third power ready signal.

7. The electronic system of claim 1, wherein the first and the second integrated circuit dies are in a single integrated circuit package, and wherein the third and the fourth integrated circuit dies are coupled to a circuit board outside the single integrated circuit package.

8. The electronic system of claim 1, wherein the first, the second, the third, and the fourth integrated circuit dies are housed in a single integrated circuit package.

9. An integrated circuit package comprising:
   a first integrated circuit die;
   a second integrated circuit die;
   a first voltage regulator circuit, wherein a first supply voltage output of the first voltage regulator circuit is coupled to a first supply voltage input of the first integrated circuit die;
   a second voltage regulator circuit, wherein a second supply voltage output of the second voltage regulator circuit is coupled to a second supply voltage input of the second integrated circuit die;
   a third voltage regulator circuit; and
   a logic gate circuit comprising a first input coupled to a first power ready output of the first voltage regulator circuit and a second input coupled to a second power ready output of the second voltage regulator circuit, and
   wherein an enable input of the third voltage regulator circuit is responsive to a logic output of the logic gate circuit indicating when the first power ready output indicates that the first supply voltage output has reached a first threshold voltage and the second power ready output indicates that the second supply voltage output has reached a second threshold voltage.

10. The integrated circuit package of claim 9 further comprising:
    a third integrated circuit die, wherein a third supply voltage output of the third voltage regulator circuit is coupled to a third supply voltage input of the third integrated circuit die, and wherein the third voltage regulator circuit generates a supply voltage at the third supply voltage output in response to the logic output.

11. The integrated circuit package of claim 9 further comprising:
    a third integrated circuit die, wherein a third supply voltage output of the third voltage regulator circuit is coupled to a third supply voltage input of the third integrated circuit die.

12. The integrated circuit package of claim 11 further comprising:

a fourth voltage regulator circuit, wherein the logic gate circuit further comprises a third input coupled to a third power ready output of the fourth voltage regulator circuit.

13. The integrated circuit package of claim 12, wherein the logic output indicates when the third power ready output indicates that a fourth supply voltage output of the fourth voltage regulator circuit has reached a third threshold voltage.

14. The integrated circuit package of claim 12, wherein the enable input of the third voltage regulator circuit is responsive to the logic output of the logic gate circuit indicating when a fourth supply voltage output of the fourth voltage regulator circuit has reached a third threshold voltage.

15. The integrated circuit package of claim 9, wherein a third integrated circuit die comprises a power-on reset monitoring circuit, and wherein a third supply voltage output of the third voltage regulator circuit is coupled to an input of the power-on reset monitoring circuit.

16. A method for powering up an electronic system, the method comprising:
    generating a first supply voltage using a first voltage regulator circuit in a first integrated circuit die, wherein the first supply voltage is provided to a second integrated circuit die;
    generating a first power ready signal using the first voltage regulator circuit in response to the first supply voltage reaching a first threshold voltage;
    generating a second supply voltage using a second voltage regulator circuit in a third integrated circuit die, wherein the second supply voltage is provided to a fourth integrated circuit die;
    generating a second power ready signal using the second voltage regulator circuit in response to the second supply voltage reaching a second threshold voltage;
    performing a logic function on the first and the second power ready signals using a logic gate circuit to generate a third power ready signal; and
    generating a third supply voltage using a third voltage regulator circuit in a fifth integrated circuit die in response to the third power ready signal.

17. The method of claim 16 further comprising:
    generating a fourth supply voltage using a fourth voltage regulator circuit in a sixth integrated circuit die, wherein the fourth supply voltage is provided to a seventh integrated circuit die; and
    generating a fourth power ready signal using the fourth voltage regulator circuit in response to the fourth supply voltage reaching a third threshold voltage.

18. The method of claim 17, wherein generating the first supply voltage using the first voltage regulator circuit comprises generating the first supply voltage using the first voltage regulator circuit in response to an enable signal.

19. The method of claim 17, wherein performing the logic function on the first and the second power ready signals using the logic gate circuit further comprises performing the logic function on the first, the second, and the fourth power ready signals using the logic gate circuit to generate the third power ready signal.

20. The method of claim 16 further comprising:
    providing the third supply voltage to a sixth integrated circuit die.

* * * * *